(12) United States Patent
Shiel et al.

(10) Patent No.: US 6,300,162 B1
(45) Date of Patent: Oct. 9, 2001

(54) METHOD OF APPLYING A PROTECTIVE LAYER TO A MICROELECTRONIC COMPONENT

(75) Inventors: Roger R. Shiel, Vinton; Brian K. Smith, Marion, both of IA (US)

(73) Assignee: Rockwell Collins, Cedar Rapids, IA (US)

( * ) Notice: Subject to any disclaimer, the term of this patent is extended or adjusted under 35 U.S.C. 154(b) by 0 days.

(21) Appl. No.: 09/566,523

(22) Filed: May 8, 2000

(51) Int. Cl.[7] .......................... H01L 21/44; H01L 21/48; H01L 21/50

(52) U.S. Cl. .................. 438/106; 438/115; 438/121; 438/125

(58) Field of Search .................... 438/106, 115, 438/125, 121

(56) References Cited

U.S. PATENT DOCUMENTS 4,017,340 * 4/1977 Yerman .
4,633,573 * 1/1987 Scherer .
5,243,756 * 9/1993 Hambergen et al. .

OTHER PUBLICATIONS

Tummala, R. et al., Microelectronics Packaging Handbook, Part III, 1997, Chapman & Hall, p. 364.*

* cited by examiner

Primary Examiner—Jey Tsai
Assistant Examiner—Josetta I. Jones
(74) Attorney, Agent, or Firm—Nathan O. Jensen; Kyle Eppele

(57) ABSTRACT

A method of protecting an electronic component from damage, wherein the electronic component includes a semiconductor chip. According to the method, a first protective substance is applied to an outer surface of the semiconductor chip. The first protective substance has a coefficient of thermal expansion substantially similar to the coefficient of thermal expansion of the semiconductor chip. A second substance may then applied to an outer surface of the first protective substance. The first protective substance is applied such that it protects the semiconductor chip from damage during the application of the second substance.

11 Claims, 3 Drawing Sheets

METHOD OF APPLYING A PROTECTIVE LAYER TO A MICROELECTRONIC COMPONENT

FIELD OF THE INVENTION

The invention relates to the manufacture of microelectronic devices. More particularly, the invention relates to protecting semiconductor components from various kinds of damage.

BACKGROUND OF THE INVENTION

The manufacture of microelectronics has become a major worldwide industry. A typical process in manufacturing a microelectronic component includes securing a semiconductor chip or die on a circuit board. Small wires, welded into place using an automated welding process known as wire bonding, connect the electronic circuitry on the chip to circuitry on the lead frame package. Such a process permits complex circuits to be made in a more standard durable package.

One issue that is of particular concern to the microelectronics industry is reverse engineering. Using readily available equipment, it is possible to analyze in detail the layout of a chip's circuitry and then copy the design for use in a competing product. Because reverse engineering a chip is significantly less expensive and may require less technology than designing a competing chip from scratch, the incentive to reverse-engineer a semiconductor chip is very great.

Various methods of defeating reverse engineering have been proposed. One such method is to cover a chip with an impermeable coating, such as a thermal spray, and then cure the coating using a predetermined cure schedule. The coating prevents analysis of the circuitry on the chip and cannot be removed without completely destroying the circuitry. One challenge of using impermeable coatings is that the ideal materials for such a coating behave quite differently from the silicon-based chip the coating is designed to protect. Of particular concern is the difference in the coefficient of thermal expansion of each of the many materials involved. If the difference between the materials' coefficients of thermal expansion is too great, the coating will destroy the circuitry during the curing process or damage the small bond wires connecting the chip to the lead frame package. Furthermore, some coatings may need to be applied to the chip at high temperatures. A chip exposed to high temperatures in the application stage, or in the curing stage mentioned above, may be adversely affected with respect to performance and may encounter unacceptable failure rates of the microelectronic chip or module.

Another issue, unrelated to reverse-engineering concerns, is that the top layer of microelectronic circuit lines on the chip is not designed to be resistant to scratching, impact, or temperature change. Even incidental contact with the chip may cause a failure of part of the circuitry in the chip.

It is therefore an object of the present invention to protect the integrity of an electronic chip or module while preventing the chip or module from being reverse-engineered.

It is another object of the invention to protect an electronic component from temperature damage during heat-intensive manufacturing processes.

It is another object of the invention to prevent damage to an electronic component due to impact, scratching, and/or temperature changes.

SUMMARY OF THE INVENTION

The invention provides a method of protecting an electronic component from damage, wherein the electronic component includes a semiconductor chip. According to the method, a first protective substance is applied to an outer surface of the semiconductor chip. The first protective substance has a coefficient of thermal expansion substantially similar to the coefficient of thermal expansion of the semiconductor chip. A second substance is then applied to an outer surface of the first protective substance. The first protective substance is applied such that it protects the semiconductor chip from damage during the application of the second substance.

According to another aspect of the invention, a method of increasing the tamper-resistance of an electronic component is provided. A first protective substance is applied to an outer surface of a semiconductor chip that forms part of the electronic component. The first protective substance has a coefficient of thermal expansion substantially similar to the coefficient of thermal expansion of the semiconductor chip. A second substance is applied to an outer surface of the first protective substance such that the second substance prevents access to the semiconductor chip. The first protective substance is applied so that it protects the semiconductor chip from damage during the application of the second substance.

According to still another aspect of the invention, A method of protecting an outer surface of a semiconductor chip is provided. According to the method, multiple layers of a protective substance are applied to an outer surface of the semiconductor chip. The protective substance has a coefficient of thermal expansion substantially similar to the coefficient of thermal expansion of the semiconductor chip. The semiconductor chip is cured or semi-cured after applying each of the layers of the protective substance.

DETAILED DESCRIPTION OF THE DRAWINGS

Figure 1:
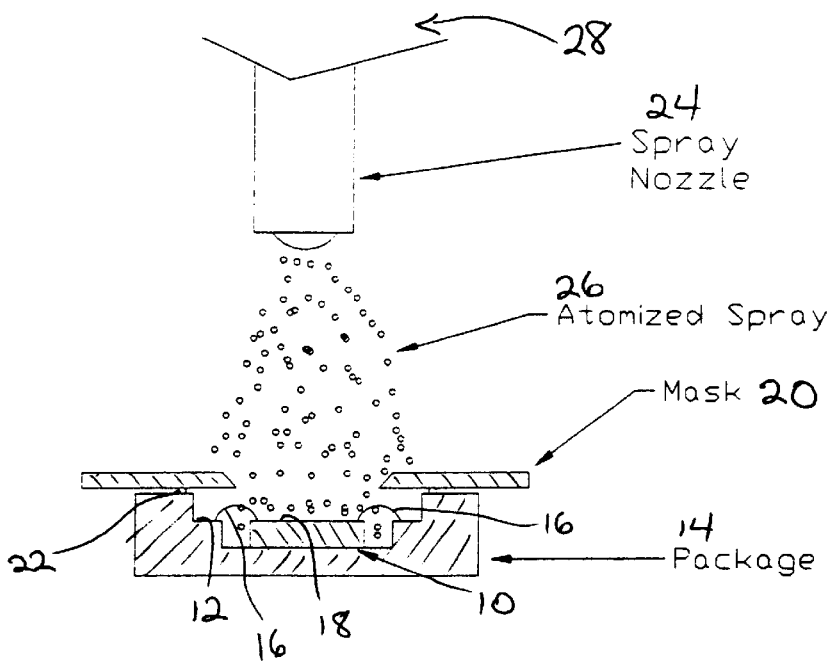
FIG. 1 is a side elevational view showing one method of applying a protective coating according to the invention.

FIG. 1 shows a semiconductor die or chip 10 attached to the bond pads 12 of a lead frame package 14. Wire bonds 16 connect the circuitry of chip 10 with the circuitry of lead frame package 14. As is known in the art, multiple semiconductor chips may be attached to a single lead frame package to form a multi-chip module.

As previously discussed, it may be desirable to apply a coating to the outer surface 18 of chip 10 to ruggedize the chip or make the chip more tamper-resistant. If the coating or its primer has a coefficient of thermal expansion (CTE) significantly different from the coefficient of thermal expansion of the chip, it is likely that damage will occur to the chip during the normal heat-intensive application and/or curing process.

Figure 2:
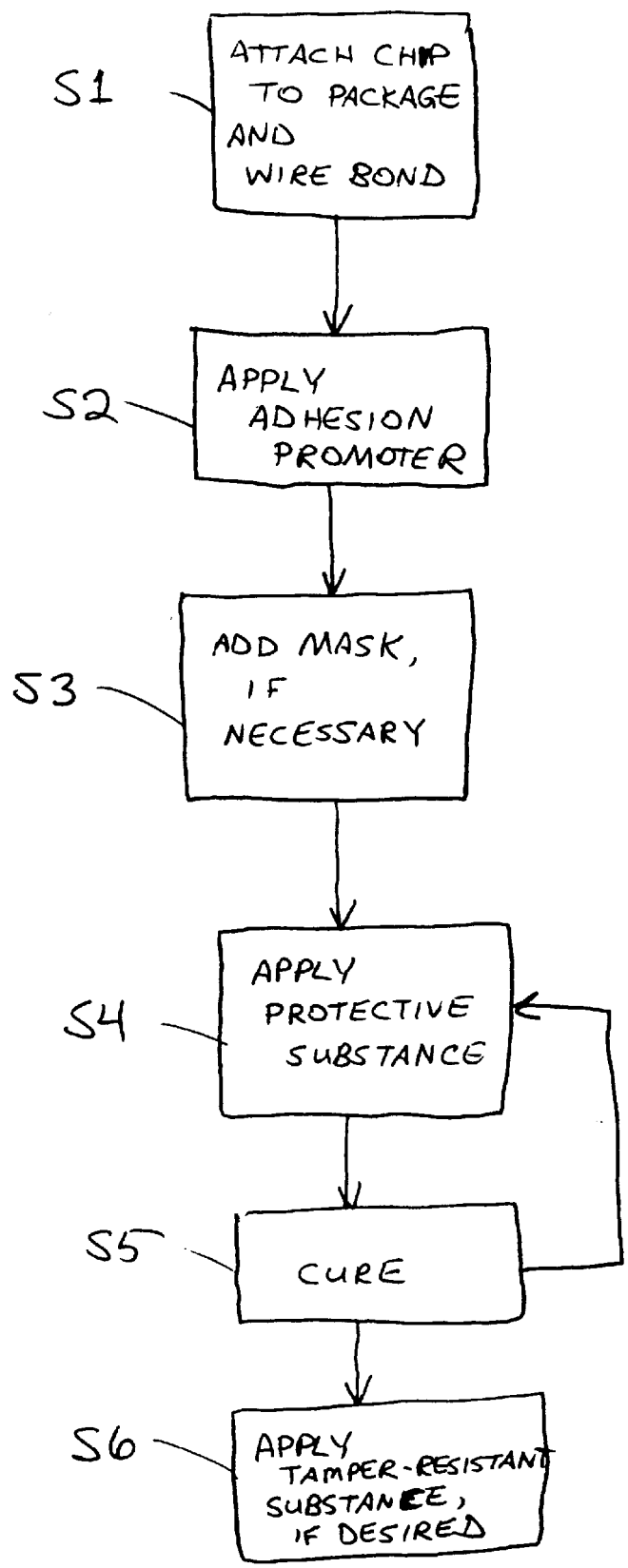
FIG. 2 is a block diagram outlining a process of applying a protective coating according to the invention.

The invention solves this problem by providing a method in which a protective substance P is applied to outer surface 18 of the chip prior to applying the tamper-resistant coating or its primer. FIG. 2 is a flowchart describing one embodiment of the method of the invention. In step S1, chip 10 is attached to package 14 and wire bonded (FIG. 1). In step S2, an adhesion promoter may be applied to outer surface 18 to aid in the adhesion of protective substance P to the outer surface. An acceptable adhesion promoter is an organosilane manufactured by HD Microsystems of Wilmington, Del. In step S3, a mask 20 is placed around the chip to isolate the area where protective substance P is to be applied. Mask 20 rests upon or otherwise protects a seal ring 22, which forms part of package 14. In step S4, protective substance P is applied to the outer surface of the chip. This is accomplished in FIG. 1 by providing a spray nozzle 24 that dispenses protective substance P in a fine, atomized spray 26 such that very small droplets of the protective substance are deposited on outer surface 18. Spray nozzle 24 may be part of a manually held airbrush 28, or may alternatively be part of an automated spray system. After protective substance P is applied to outer surface 18, in step S5 the chip is placed in an oven (not shown) to cure or partially cure the protective substance. The temperature and duration of the curing process depends on the specific materials involved. After the layer of protective substance P has been at least partially cured on outer surface 18, additional layers of the protective substance may be placed thereon by repeating the applying and curing steps S4, S5 as outlined above. If multiple layers of protective substance are desired, the curing step between each application is shortened. In step 56, a tamper-resistant substance is applied, if desired, to the outer surface of the chip, which is now covered with a layer of protective substance P. This step also includes the application of a primer, if required. The layer of the protective substance protects the chip from damage due to heat and mechanical impact during the application of the tamper-resistant substance and TCE mismatches between the chip and the tamper-resistant substance or its primer.

Protective substance P has physical properties similar to chip 10. Specifically, the CTE of protective substance P is substantially similar to the CTE of the chip. It has been found that a polyimide identified as PI 2613 and manufactured by HD Microsystems of Wilmington, Del. has an acceptable CTE for use with silicon-based die. Of course, it is within the scope of the invention to use other substances that have physical properties similar to the components that it is desired to protect. Protective substance P must also protect chip 10 from heat and mechanical impact that may occur during a tamper-resistant coating process.

Removable mask 20 prevents contamination or damage to seal ring 22 and package 14 during application of protective substance P. Specifically, droplets of the protective substance may bridge one or more of wire bonds, and the wire bonds may be damaged or electrically shorted by the shrinkage of protective substance P during the curing operation.

The thickness of the layers of protective substance P may be controlled by varying the number of applications of the protective substance or by diluting the protective substance as desired. A solvent known as T9038 thinner, manufactured by HD Microsystems of Wilmington, Del., provides acceptable results when used with the polyimide previously mentioned. Other diluting agents may alternatively be used. Diluting protective substance P also modifies its viscosity. This will aid in the transfer of protective substance P from spray nozzle 24 to outer surface 18. The thickness and/or viscosity of protective substance P may also be varied by heating chip 10 and/or the protective substance prior to application.

Figure 4:
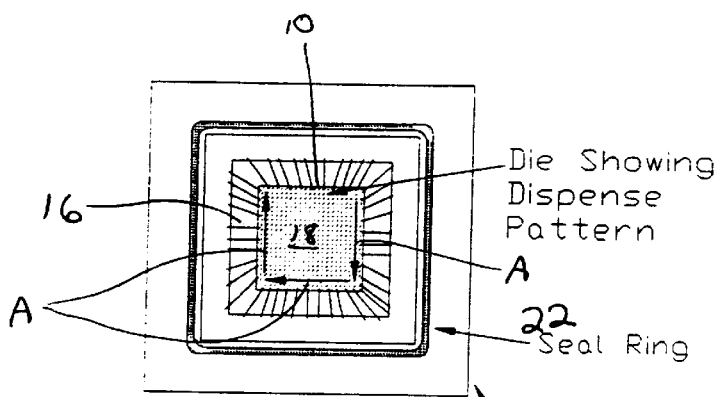
FIG. 4 is a top plan view showing a proposed sequence of applying the protective coating according to the method of FIG. 3.
Figure 3:
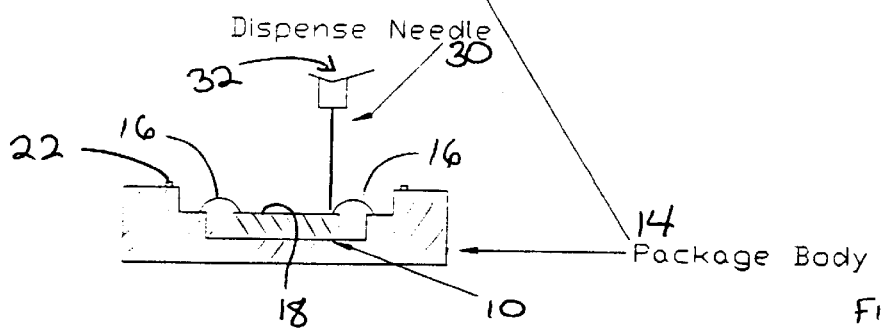
FIG. 3 is a side elevational view showing another method of applying a protective coating according to the invention.

FIGS. 3 and 4 show another embodiment of the invention. Instead of spraying protective substance P onto outer surface 18, it is possible to accurately place small droplets of the protective substance on predetermined portions of the outer surface by using a needle 30. The needle is part of a dispensing system 32, which may be a manually actuable syringe or an automated injection system. Needle 30 may be controlled to place predetermined quantities of protective substance P in a specified pattern upon outer surface 18. FIG. 4 shows such a dispensing pattern in which the protective substance is applied along the perimeter of chip 10 as indicated by arrows A. Other patterns are within the scope of this invention and may be dictated by the chip size, desired thickness of the protective layer, coating viscosity, chip topography, and chip surface cleanliness. An advantage of such precision application is that the protective substance is less likely to get on the wire bonds and seal ring, and consequently the need for a protective mask is greatly reduced.

It is possible to apply protective substance P to chip 10 before the chip is attached to package 14. For example, protective substance P may be spun onto a silicon wafer containing the chip using known spinning techniques. The thickness of the layer of protective substance P may be controlled by varying the wafer spin speed and spin duration, or by preheating or thinning protective substance P as previously discussed.

Figure 5:
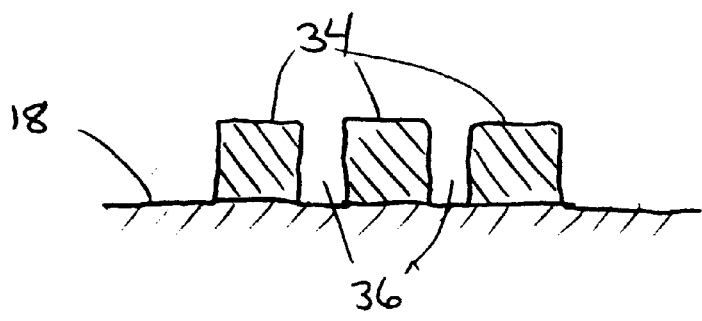
FIG. 5 is a side elevational sectional view of the surface of a semiconductor chip.
Figure 6:
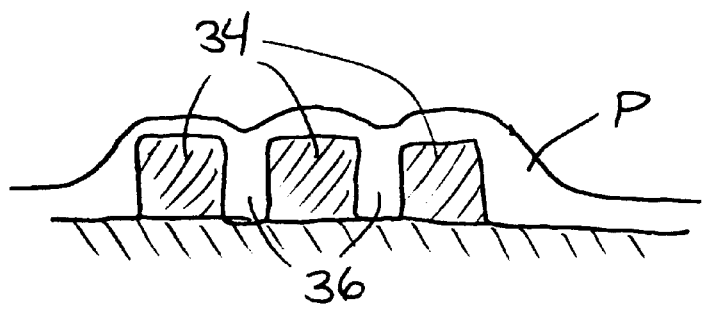
FIG. 6 is a side elevational sectional view of the semiconductor chip of FIG. 5 after application of a protective coating according to the invention.

FIG. 5 shows a cross-section of the surface of chip 10 prior to applying protective substance P thereto. Traces or circuit lines 34 protrude from outer surface 18. FIG. 6 shows a cross-section of the surface of the chip after applying the protective substance thereto. It can be seen that the spaces 36 between traces or circuit lines 34 are substantially filled. It can also be seen that protective substance P creates a more planar outer surface 18 than without the protective substance. When the surface is "planarized," it is less likely to be damaged by physical contact such as scratching. This planarization is another aspect of the protection that the protective substance affords to the chip.

It should be noted that the application of protective substance P is in addition to the typical semiconductor passivation layer that may be applied to a chip.

Thus, the invention provides a method of protecting a semiconductor chip from damage. The invention may also be used with other types of circuitry where it is desired to protect or prevent access to the circuitry.

One advantage of the invention is that protective substance P forms a buffer that provides protection from surface abrasion, surface penetration, tensile stress, CTE mismatches and ultraviolet exposure. This type of protection is especially important during the application of a thermal spray. Consequently, tamper-resistant coatings such as thermal sprays may be applied to a chip or die without significant damage thereto. This dramatically decreases the failure rate of electronic components.

Another advantage is that applying protective substance P to the chip makes the outer surface of the chip more planar. It has been found that three to four layers of the undiluted polyimide previously identified will substantially planarize the surface of a chip, although fewer layers also yield satisfactory results.

Still another advantage is that protective substance may be applied to a semiconductor die at the wafer level, in a single chip package, or to a multi-chip package or application. This provides maximum flexibility when integrating the method of the invention into current manufacturing processes.

While the invention has been disclosed in its preferred form, the specific embodiments thereof as disclosed and illustrated herein are not to be considered in a limiting sense as numerous variations are possible. The subject matter of the invention includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the invention of the present disclosure.

We claim:

1. A method of protecting an electronic component from damage, wherein the electronic component includes a semiconductor chip having a coefficient of thermal expansion, the method comprising:

spraying multiple applications of a first protective substance on an outer surface of the semiconductor chip, the first protective substance having a coefficient of thermal expansion substantially similar to the coefficient of thermal expansion of the semiconductor chip; and applying a second substance to an outer surface of the first protective substance, wherein the first protective substance protects the semiconductor chip from damage during the application of the second substance.

2. The method of claim 1, wherein the first protective substance is a polyimide.

3. The method of claim 1, wherein the second substance is a tamper-resistant coating.

4. The method of claim 1, wherein the semiconductor chip is subjected to an at least partial curing operation after each application of the first protective substance.

5. The method of claim 1, wherein the first protective substance is sprayed on the outer surface of the semiconductor chip using an airbrush.

6. The method of claim 1, wherein the first protective substance is sprayed on the outer surface of the semiconductor chip using an automated spray system.

7. The method of claim 1, wherein the semiconductor chip is attached to the electronic component using bond wires, and wherein the bond wires are shielded by a mask during application of the first protective substance so that the first protective substance is substantially prevented from being applied to the bond wires.

8. A method of protecting an electronic component from damage, wherein the electronic component includes a semiconductor chip having a coefficient of thermal expansion, the method comprising:

applying a first protective substance to an outer surface of the semiconductor chip, the first protective substance having a coefficient of thermal expansion substantially similar to the coefficient of thermal expansion of the semiconductor chip; and applying a second substance to an outer surface of the first protective substance, wherein the first protective substance protects the semiconductor chip from damage during the application of the second substance, and wherein one of thickness and viscosity of the first protective substance is variably controlled by adding a diluting agent thereto.

9. The method of claim 8, wherein the first protective substance is spun onto the outer surface of the semiconductor chip.

10. A method of protecting an electronic component from damage, wherein the electronic component includes a semiconductor chip having a coefficient of thermal expansion, the method comprising:

applying a first protective substance to an outer surface of the semiconductor chip, the first protective substance having a coefficient of thermal expansion substantially similar to the coefficient of thermal expansion of the semiconductor chip; and applying a second substance to an outer surface of the first protective substance, wherein the first protective substance protects the semiconductor chip from damage during the application of the second substance, and wherein one of thickness and viscosity of the first protective substance is variably controlled by heating at least one of the semiconductor chip and the first protective substance prior to applying the first protective substance to the semiconductor chip.

11. The method of claim 1, further including applying an adhesion promoter to the outer surface of the semiconductor chip prior to applying the first protective substance thereto.

* * * * *